(12) United States Patent
Pei et al.

(10) Patent No.: US 8,629,017 B2
(45) Date of Patent: Jan. 14, 2014

(54) STRUCTURE AND METHOD TO FORM EDRAM ON SOI SUBSTRATE

(75) Inventors: Chengwen Pei, Danbury, CT (US); Kangguo Cheng, Guilderland, NY (US); Herbert L. Ho, New Windsor, NY (US); Subramanian S. Iyer, Mount Kisco, NY (US); Byeong Y. Kim, Lagrangeville, NY (US); Geng Wang, Stormville, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/417,900

(22) Filed: Mar. 12, 2012

(65) Prior Publication Data
US 2012/0171827 A1    Jul. 5, 2012

Related U.S. Application Data

(62) Division of application No. 12/437,242, filed on May 7, 2009, now Pat. No. 8,188,528.

(51) Int. Cl.
*H01L 21/8242* (2006.01)
(52) U.S. Cl.
USPC ............ 438/243; 438/386; 257/303; 257/301
(58) Field of Classification Search
USPC .......................................................... 438/243
See application file for complete search history.

(56) References Cited

U.S. PATENT DOCUMENTS

| 5,321,289 A | 6/1994 | Baba et al. |
| 6,703,273 B2 | 3/2004 | Wang et al. |
| 2004/0150025 A1* | 8/2004 | Ogawa et al. ................. 257/301 |
| 2005/0019999 A1* | 1/2005 | Yamada et al. ............... 438/197 |
| 2007/0057302 A1* | 3/2007 | Ho et al. ....................... 257/301 |

FOREIGN PATENT DOCUMENTS

DE        10209989 A1  * 12/2002

* cited by examiner

*Primary Examiner* — Ajay K Arora
(74) *Attorney, Agent, or Firm* — Scully, Scott, Murphy & Presser, P.C.; H. Daniel Schnurmann

(57) ABSTRACT

A memory device is provided that in one embodiment includes a trench capacitor located in a semiconductor substrate including an outer electrode provided by the semiconductor substrate, an inner electrode provided by a conductive fill material, and a node dielectric layer located between the outer electrode and the inner electrode; and a semiconductor device positioned centrally over the trench capacitor. The semiconductor device includes a source region, a drain region, and a gate structure, in which the semiconductor device is formed on a semiconductor layer that is separated from the semiconductor substrate by a dielectric layer. A first contact is present extending from an upper surface of the semiconductor layer into electrical contact with the semiconductor substrate, and a second contact from the drain region of the semiconductor device in electrical contact to the conductive material within the at least one trench.

20 Claims, 12 Drawing Sheets

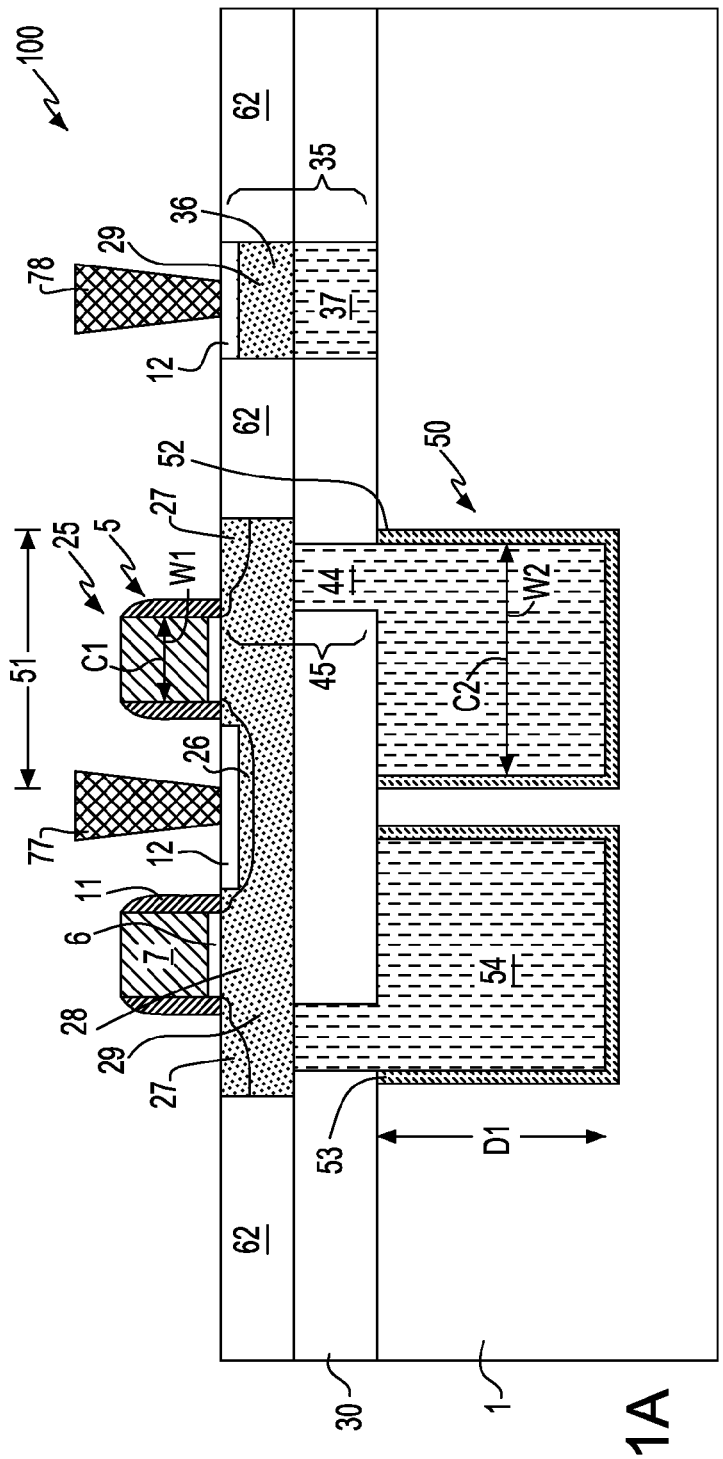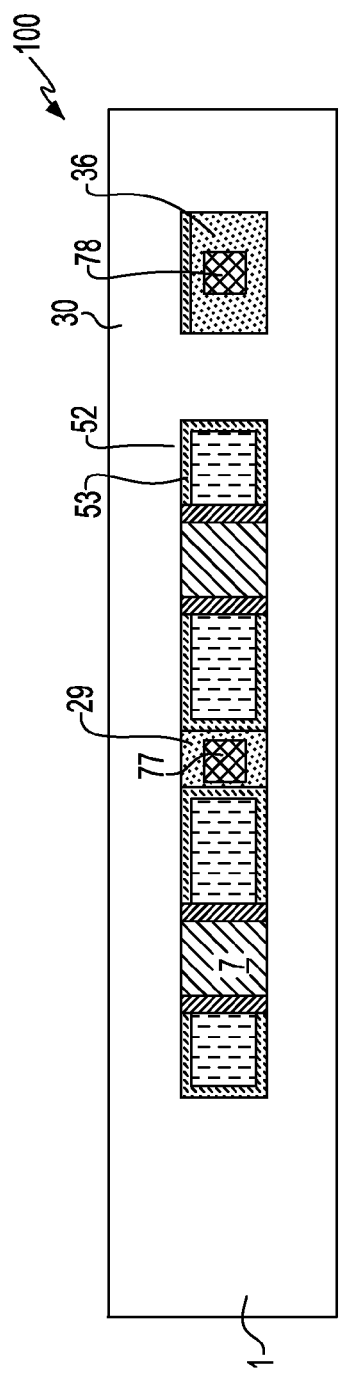
FIG. 1A
FIG. 1B

STRUCTURE AND METHOD TO FORM EDRAM ON SOI SUBSTRATE

CROSS REFERENCE TO RELATED APPLICATION

This application is a divisional of U.S. patent application Ser. No. 12/437,242, filed May 7, 2009 the entire content and disclosure of which is incorporated herein by reference.

FIELD OF THE INVENTION

The present invention generally relates to micro-electronic devices. More specifically, the present invention relates to trench memory devices.

BACKGROUND OF THE INVENTION

Embedded memory devices fabricated with trench capacitors and/or vertical transistor cells have benefits over planar-stacked device structures. Trench capacitors have replaced the planar storage capacitor in order to meet the scaling demands for high performance DRAM (dynamic random access memory) cell production.

A trench capacitor is a three dimensional device formed by etching a trench into a semiconductor substrate. After trench etching, a buried plate electrode is formed about the exterior portion of the trench and a node dielectric is then formed on the inner walls of the trench. The trench is then filled, for example, with N-type polycrystalline silicon ("N-type Poly-Si"). In order to obtain sufficient capacitance, a dopant level of about $10^{19}$ atoms/cm$^3$ is commonly utilized. The doped Poly-Si serves as one electrode of the capacitor, often referred to as the upper electrode or storage node. An N-type doped region surrounds the lower portion of the trench, serving as the second electrode and is referred to as the lower electrode or a "buried plate" or "diffusion plate". A node dielectric separates the buried plate and the upper electrode and serves as the insulating layer of the capacitor.

SUMMARY OF THE INVENTION

A memory device is provided that in one embodiment includes at least one trench capacitor located in a semiconductor substrate having an outer electrode provided by a doped portion of the semiconductor substrate, an inner electrode provided by a conductive fill material, and a node dielectric layer located between the outer electrode and the inner electrode, in which at least one semiconductor device is positioned centrally over the at least one trench capacitor. The semiconductor device may further include a source region, a drain region, and a gate structure, wherein the semiconductor device may be present on a semiconductor layer that is separated from the semiconductor substrate by a dielectric layer. The memory device may further include a first contact extending from an upper surface of the semiconductor layer on which the semiconductor device is present in electrical contact with the semiconductor substrate, and a second contact from the drain region of the semiconductor device that is in electrical contact to the conductive material within the at least one trench.

In another aspect, a method of providing a memory structure is provided. Broadly, the method includes providing a semiconductor substrate and forming a trench capacitor in the semiconductor substrate, the trench capacitor including an inner electrode comprised of a conductive fill material within a trench. Thereafter, a buried dielectric layer is formed on the semiconductor substrate, followed by a semiconductor layer being formed on the buried dielectric layer. A first stud and second stud are then formed in the buried dielectric layer, in which the first stud is in electrical communication with the conductive material that is present within the trench, and the second stud is in electrical communication with the semiconductor substrate. A semiconductor layer is then formed on the buried dielectric layer.

In a following step, a semiconductor device may then be formed atop the semiconductor layer being centrally positioned over the trench. The semiconductor device may include a gate structure, a source region and a drain region, in which the drain region may be in electrical communication with the first stud.

In another embodiment, a structure is provided having a first memory structure including a capacitor of a first width and a second memory structure including a capacitor of a second width, wherein the second width is greater than the first width. The first memory device may further include a first trench capacitor having a first outer electrode provided by a first doped portion of a semiconductor substrate, a first inner electrode provided by a first conductive fill material, and a first node dielectric layer located between the outer electrode and the inner electrode. The first memory device further includes at least one first semiconductor device that is located over the first trench capacitor and is separated from the first trench capacitor by a dielectric layer. The first semiconductor device is in electrical contact with the first trench capacitor through a first electrical contact extending from a drain of the first semiconductor device through the dielectric layer to the first inner electrode. The second memory device may include a second trench capacitor having a second outer electrode provided by a second doped portion of the semiconductor substrate, a second inner electrode provided by a second conductive fill material, and a second node dielectric layer located between the second outer electrode and the second inner electrode. The second memory device may further include a second semiconductor device that is located over the second trench capacitor and is separated from the second trench capacitor by the dielectric layer. The second semiconductor device is in electrical contact with the second trench capacitor through a second electrical contact extending from a drain of the second semiconductor device through the dielectric layer to the second inner electrode.

In another aspect, a method for forming a memory device is provided that may include providing a semiconductor substrate having at least one trench capacitor formed therein; having a gate structure, a source region, and a drain region forming a buried dielectric layer on the semiconductor substrate; forming a semiconductor device atop the buried dielectric layer; and forming a first contact in electrical contact with the semiconductor substrate and a second contact from the drain region of the semiconductor device into electrical contact to an inner electrode of the at least one trench capacitor.

Other aspects, features and advantages of the invention will be more fully apparent from the ensuing disclosure and appended claims.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 1A depicts a side cross-sectional view of a memory device including a planar semiconductor device being centrally positioned over trench capacitors, in accordance with one embodiment of the present invention.

FIG. 1B is a top down view of the memory device depicted in FIG. 1A.

DETAILED DESCRIPTION OF THE INVENTION

Figure 2:
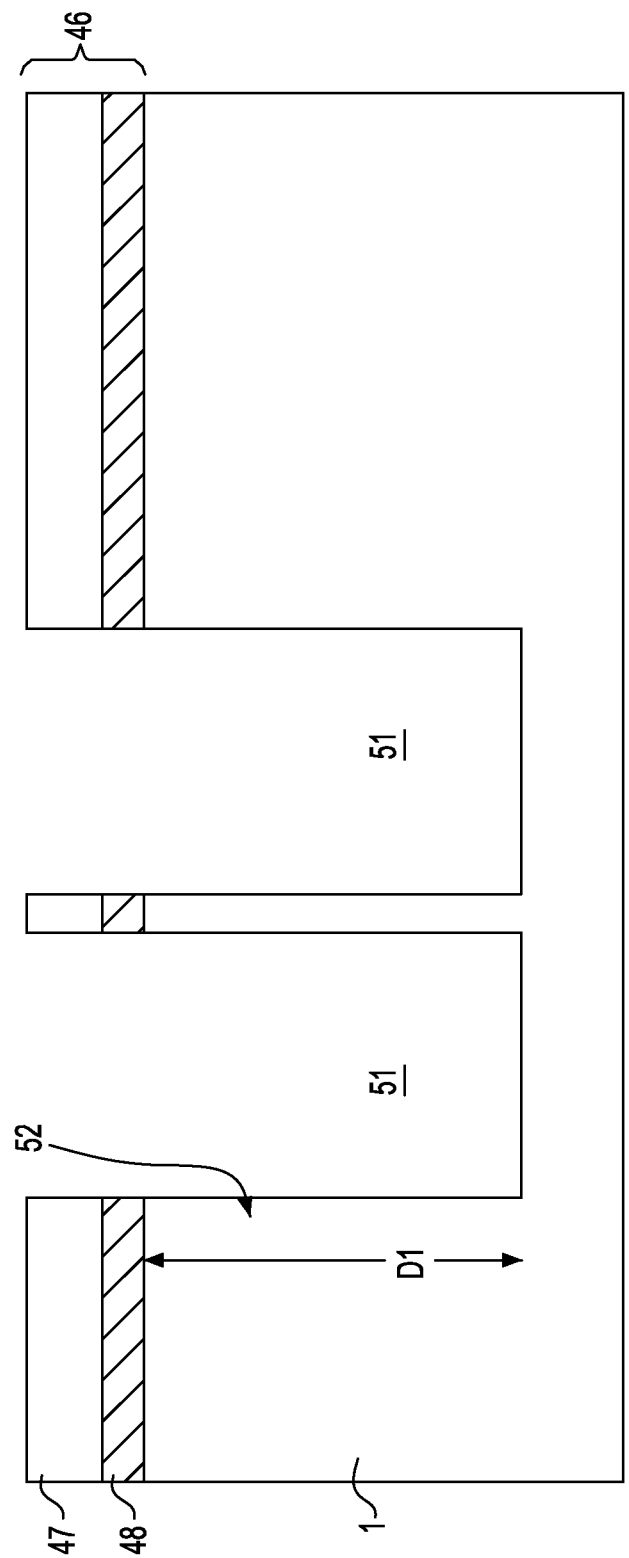
FIG. 2 depicts a side cross-sectional view of a semiconductor substrate having at least one trench formed therein, as used in forming a memory device, in accordance with one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods for forming electrical devices, such as memory devices including trench capacitors. When describing the methods and structures, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping means adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor.

As used herein, "P-type" refers to the addition of impurities to an intrinsic semiconductor that creates deficiencies of valence electrons, such as the addition of boron, aluminum, or gallium to a type IV semiconductor, such as silicon.

As used herein, "N-type" refers to the addition of impurities to an intrinsic semiconductor that contribute free elections, such as the addition of antimony, arsenic, or phosphorous to a type IV semiconductor, such as silicon.

As used herein, a "field effect transistor (FET)" is a transistor in which output current, i.e., source-drain current, is controlled by the voltage applied to the gate. A field effect transistor has three terminals, i.e., a gate, a source and a drain.

As used herein, the term "drain" means a doped region in a semiconductor substrate that is located at the end of the channel in a field effect transistors (FET), in which carriers are flowing out of the transistor through the drain.

As used herein, the term "source" is a doped region from which majority carriers are flowing into the channel.

As used herein, the term "channel" is the region between the source and drain that becomes conductive when the transistor is turned on.

A "gate structure" means a structure used to control output current (i.e., flow of carriers in the channel) of a semiconducting device, such as a field effect transistor (FET).

As used herein, the term "gate conductor" denotes a material having a bulk resistivity ranging from $10^{-4}$ $\Omega$-cm to $10^{-6}$ $\Omega$-cm, which is positioned atop a gate dielectric.

As used herein, a "metal" is an electrically conductive material, wherein metals atoms are held together by the force of metallic bonds, and the energy band structure of the metal's conduction and valence bands overlap, and hence, there is no energy gap.

As used herein, a "gate dielectric" is a layer of dielectric between the semiconductor substrate and the gate conductor.

As used herein, the term "dielectric" denotes a non-metallic material having a room temperature conductivity of less than about $10^{-10}(\Omega\text{-m})^{-1}$.

As used herein, "high-k" denotes a dielectric material featuring a dielectric constant (k) higher than the dielectric constant of $SiO_2$.

As used herein, the term "memory device" means a structure in which the electrical state can be altered and then retained in the altered state, in this way a bit of information can be stored.

A "silicide" is an alloy of a metal and silicon.

"Electrically conductive" as used through the present disclosure means a material typically having a room temperature conductivity of greater than $10^{-8}$ $(\Omega\text{-m})^{-1}$.

As used herein, the term "electrical communication" means that a first structure or material can conduct electricity to a second structure or material.

A "capacitor" is a structure for storing a charge including two electrically conductive materials separated and insulated from each other by a dielectric.

The term "electrode" as used to describe a component of the capacitor represents one of the two electrically conductive materials of the capacitor that are separated by the dielectric layer.

"Doped portion" as used to describe the outer electrode of the capacitor means that the portion of the semiconductor substrate about the trench has been doped to be electrically conductive.

A "node dielectric layer" is the dielectric layer that is present between the electrodes of the capacitor.

For purposes of the description hereinafter, the terms "upper", "lower", "right", "left", "vertical", "horizontal", "top", "bottom", and derivatives thereof shall relate to the invention, as it is oriented in the drawing figures.

Further, it will be understood that when an element, such as a layer, region or substrate, is referred to as being "atop" or "over" or "overlying" or "below" or "underlying" another element, it can be directly on the other element or intervening elements may also be present. In contrast, when an element is referred to as being "directly on" or "directly over" or in "direct physical contact" with another element, there are no intervening elements present.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIGS. 1A and 1B depict one embodiment of a memory device 100 in accordance with the present invention. Broadly, a memory device 100 is provided that includes at least one trench capacitor 50 and at least one semiconductor device 25, e.g., access transistor, such as a field effect transistor, in which the at least one semiconductor device 25 is positioned centrally over the at least one trench capacitor 50. The term "positioned centrally over" as used to describe the relationship of the semiconductor device 25 to the underlying trench capacitor 50 means that the center $C_1$ of the width $W_1$ of the gate structure 5 of the semiconductor device 25 is substantially aligned to the center $C_2$ of the width $W_2$ of the trench 51, in which the trench capacitor 50 is present. By "substantially aligned" it is meant that the center $C_1$ of the gate structure 5 may not be horizontally offset from the center $C_2$ of the trench 51 by a dimension that is greater than 25% of the width $W_2$ of the trench 51. In one embodiment, the center $C_1$ of the gate structure 5 may not be horizontally offset from the center $C_2$ of the trench 51 by a dimension that is greater than 15% of the width $W_2$ of the trench 51. In another embodiment, the center $C_1$ of the gate structure 5 may not be horizontally offset from the center $C_2$ of the trench 51 by a dimension that is greater than 10% of the width $W_2$ of the trench 51, typically being less than 5% of the width $W_2$ of the trench 51. In one example, the center $C_1$ of the gate structure 5 is aligned to the center $C_2$ of the trench 51 having no observable horizontal offset between the structures. The structure depicted in FIG. 1 may provide a 30% to 40% reduction in the real estate that is occupied by the memory device in comparison to memory devices in which the access transistor is not present overlying the capacitor.

The trench capacitor 50 is typically located in a semiconductor substrate 1. The trench 51 in which the trench capacitor 50 is present may have a width $W_2$ that ranges from 30 nm or less to 200 nm, and has a depth $D_1$ ranging from 500 nm to 6000 nm, more typically having a width $W_2$ that ranges from 50 nm to 100 nm, and having a depth $D_1$ that ranges from 3000 nm to 5000 nm. In another embodiment, the trench capacitor 50 has a width ranging from 30 nm to 300 nm, and a depth ranging from 2000 nm to 6000 nm.

In one embodiment, the trench capacitor 50 includes an outer electrode 52 that is provided by a doped portion of the semiconductor substrate 1, an inner electrode 54 provided by a conductive fill material, and a node dielectric layer 53 located between the outer electrode 52 and the inner electrode 54. In one example, the node dielectric 53 is composed of a high-k dielectric material, although other dielectric materials, such as silicon nitride are contemplated for the node dielectric 53. The conductive fill material typically includes n$^+$ polysilicon or an elemental metal. The doped portion of the semiconductor substrate 1 that provides the outer electrode 52 is typically a silicon containing region that has been doped to an n+ conductivity. For example, the outer electrode 52 may be provided by doping the silicon-containing semiconductor substrate 1 with antimony, arsenic or phosphorous present in a concentration ranging from about $1 \times 10^{17}$ atom/cm$^3$ to about $1 \times 10^{20}$ atom/cm$^3$.

The semiconductor device 25 may further include a source region 26, a drain region 27, and a gate structure 5, in which a channel region 28 is present underlying the gate structure 5 and between the source region 26 and drain region 27. In one embodiment, the semiconductor device 25 may be present on a semiconductor layer 29 (also referred to as an SOI layer 29) that is separated from the semiconductor substrate 1 by a dielectric layer 30 (also referred to as a buried dielectric layer 30). Typically, the semiconductor device 25 is a planar device, in which the length of the channel region 28 is parallel to the upper surface of the SOI layer 29 in which the semiconductor device 25 is formed. The semiconductor device 25 may be an n-channel field effect transistor (n-FET) or a p-channel field effect transistor (p-FET).

The memory device 100 depicted in FIG. 1A may further include a first contact 35 extending from an upper surface of the semiconductor layer 29 into electrical contact with the semiconductor substrate 1. In one embodiment, the first contact 35 includes a substrate contact portion 36 of the SOI layer 29 and a second stud 37 that is formed in the buried dielectric layer 30. The substrate contact portion of the SOI layer 29 is separated from the portion of the SOI layer 29 overlying the trench capacitors 50 by an isolation region 62. A second contact 45 may be present extending from the drain region 27 of the semiconductor device 25 into electrical contact with the conductive material, i.e., the inner electrode 54, that is present within the trench 51. The second contact 45 may include a second stud 44 that is formed in the buried dielectric layer 30.

The structure depicted in FIG. 1A does not require a strap region composed of Arsenic-doped Silicate Glass (ASG) between the semiconductor device and the trench capacitor or a lower electrode that is provided by an Arsenic-doped Silicate Glass (ASG) diffusion process. The memory device provided in FIG. 1A may be formed using a single polysilicon fill process to provide a robust trench capacitor without requiring a polysilicon recess process, such as polysilicon etching.

The remaining elements depicted in FIG. 1A that have not been described above, will be described in reference to FIGS. 2-6. FIGS. 2-6 depict one embodiment of a method for forming the structure depicted in FIGS. 1A and 1B. FIG. 2 depicts a semiconductor substrate 1 having at least one trench 51 formed therein, in which a pad stack 46 is present atop the semiconductor substrate 1.

The semiconductor substrate 1 may be composed of any semiconductor material including, but not limited to: Si, SiC, SiGe, SiGeC, Ge alloys, GaAs, InAs, InP, as well as other III-V or II-VI compound semiconductors. The semiconductor substrate 1 may further comprise a layered semiconductor structure such as Si/SiGe, a silicon-on-insulator structure or a SiGe-on-insulator structure. The semiconductor substrate 1 may be doped, undoped or contain doped and undoped regions therein (not shown). In one embodiment, the semiconductor substrate 1 includes a silicon containing material doped with antimony, arsenic or phosphorous present in a concentration ranging from $2\times10^{18}$ atom/cm$^3$ to $5\times10^{19}$ atom/cm$^3$. The doped device regions are typically known as "wells". The semiconductor substrate 1 may be composed of single crystal silicon. The doped portion of the semiconductor substrate 1 that provides the outer electrode 52 of the subsequently formed trench capacitors 50 is typically a silicon-containing region that has been doped to an n$^+$ conductivity or a p$^+$ conductivity. In one embodiment, that doped portion of the semiconductor substrate 1 that provides the outer electrode of the subsequently formed trench capacitors 50 may be provided by doping the semiconductor substrate 1 with antimony, arsenic or phosphorous present in a concentration ranging from about $1\times10^{17}$ atom/cm$^3$ to about $1\times10^{20}$ atom/cm$^3$.

In one embodiment, the pad stack 46 may be comprised of at least two material layers including a lower pad nitride layer 48 (first pad dielectric layer) and an upper oxide pad layer 47 (second pad dielectric layer). The thickness of the pad stack 46 may vary depending on the number of material layers within the stack. Typically, the overall thickness for the pad stack 46 including the upper oxide pad layer 47 and the lower nitride pad layer 48 is from about 20 nm to about 500 nm. In an exemplary embodiment, the upper oxide pad layer 47 has a thickness from about 5 nm to about 10 nm, and the lower nitride pad layer 48 has a thickness from about 100 nm to about 200 nm.

The pad stack 46 is formed on the surface of the semiconductor substrate 1 using one or more conventional blanket deposition techniques such as, for example, chemical vapor deposition (CVD), plasma enhanced chemical vapor deposition (PECVD), evaporation, chemical solution deposition or atomic layer deposition. In addition to deposition processes, the various material layers of the pad stack 46 can be formed by thermal oxidation or thermal nitridation. A combination of the aforementioned techniques can also be used.

At least one trench 51 is then formed in the semiconductor substrate 1. The at least one trench 51 may be formed using photolithography and etching. For example, the photolithographic step may include applying a photoresist to the upper surface of the pad stack 46, exposing the photoresist to a pattern of radiation and developing the pattern into the exposed photoresist utilizing a resist developer to provide a first etch mask. The first etch mask may be patterned to expose the portion of the pad stack 46 that is overlying the portion of the semiconductor substrate 1 in which the at least one trench 51 is formed, and is hereafter referred to as a resist having trench openings.

After forming the resist having the trench openings, the pattern is first transferred to the upper oxide pad layer 47 utilizing an anisotropic etching process, such as reactive ion etching, ion beam etching, plasma etching or laser ablation. The resist can be removed after the trench pattern has been transferred to the upper oxide pad layer 47, or it can remain on the structure during the transfer of the pattern from the hardmask to the lower nitride pad layer 48 and then to the semiconductor substrate 1 to provide the at least one trench 51. These later pattern transfer steps can be performed utilizing etching process, such as reactive ion etch. Following formation of the trenches 51 the resist having the trench openings is then removed by a chemical stripping process or oxygen ashing. Each of the trenches 51 has a depth D1 that ranges from about 1 µm to about 5 µm, as measured from the upper surface of the semiconductor substrate 1. In another embodiment, each of the trenches 51 has a depth D1 that ranges from about 1 µm to about 2 µm.

The outer electrode 52 is typically provided by the dopants of the semiconductor substrate 1 that are present in the sidewalls of the trench 51. In one embodiment, in which the dopant for the outer electrode 52 is not present prior to the formation of the trenches 51, the outer electrode 52 may be formed at this stage of the method. In one embodiment, the outer electrode 52 is formed by a N$^+$ buried plate diffusion region that is present about the sidewalls of the trench 51 using a conventional process that is capable of diffusing N$^+$ dopant through the trench walls. For example, the dopant source to produce the N$^+$ outer electrode 52 may be ion-implantation of an impurity, such as As or P, into the trench 51. In one embodiment, As is ion-injected into the trench 51 under the conditions of an accelerating voltage, of about 40 kV, and at about dose of $10^{15}$/cm$^2$. In another embodiment, depositing a layer of N-type doped material, such as arsenic doped silicate glass, may also form an N$^+$ outer electrode 52. After the impurities are introduced to the sidewalls of the trench 51, the semiconductor substrate 1 is then heated in an N$_2$ atmosphere at a temperature of about 900° C. for about 30 minutes, thereby diffusing N-type dopants into the semiconductor substrate 1, and forming a N$^+$ outer electrode 52 around the trench 51.

Connecting the N$^+$ outer electrode 52 of the trench capacitor 50 to the subsequently formed first contact 35 (see FIG. 1A) within the semiconductor substrate 1 is a buried well (not shown). Alternatively, the trench capacitor 50 may be electrically connected through the out diffused dopants of the outer electrode 52.

Figure 3:
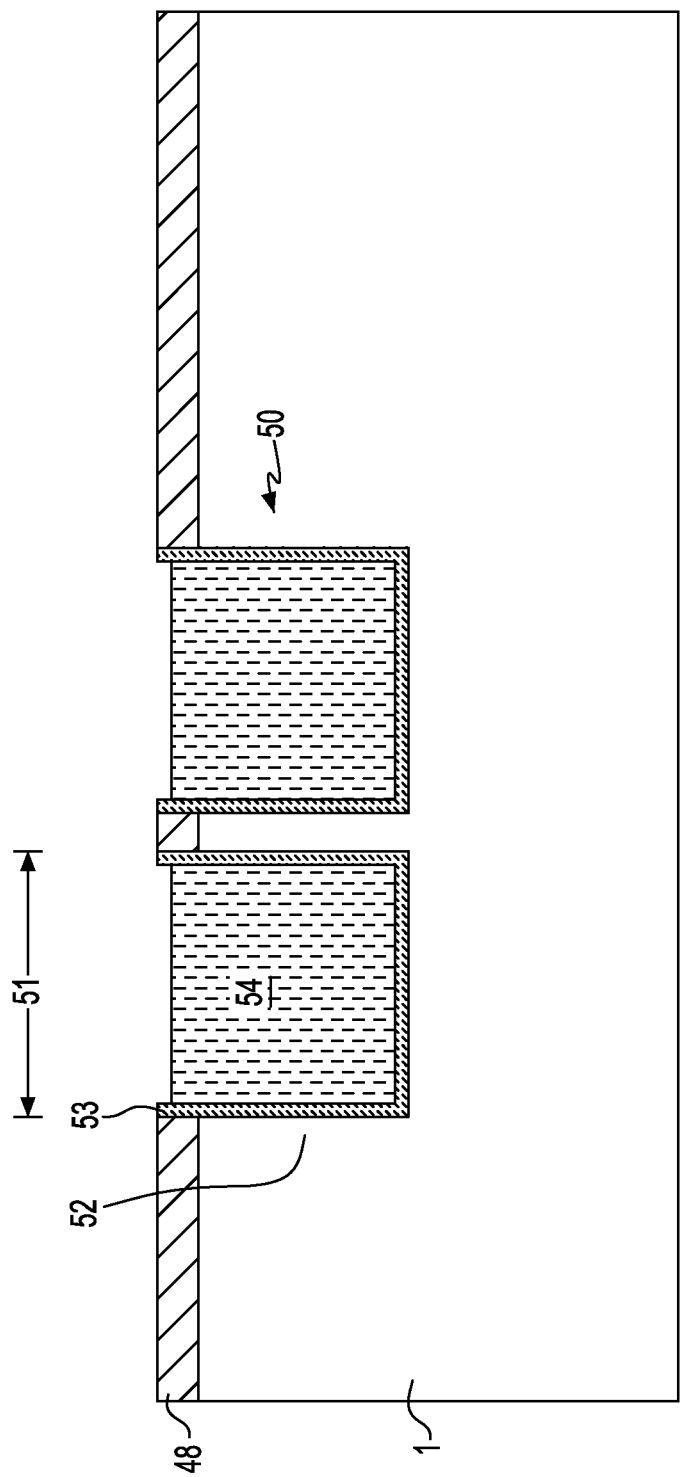
FIG. 3 depicts a side cross-sectional view of forming a node dielectric on the sidewalls of the at least one trench, and forming a conductive material within the at least one trench.

Referring to FIG. 3, a node dielectric layer 53 is then conformally formed on the sidewalls and base of the trench 51. The node dielectric layer 53 is positioned between and separates the electrodes 52, 54 of the trench capacitor 55. The node dielectric layer 53 may be composed of any dielectric material including, but not limited to: Si$_3$N$_4$, SiO$_2$, Al$_2$O$_3$, ZrO$_2$, and HfO$_2$. The node dielectric layer 53 has a thickness of from 2.5 nm to 7.0 nm, with a thickness of from about 3.0 nm to 5.0 nm being more typical. In one embodiment, the node dielectric layer 53 is composed of a high-k material having a dielectric constant greater than 3.9. In another embodiment, the node dielectric layer 53 is composed of a high-k material having a dielectric constant greater than 7.0. In one embodiment, the upper oxide pad layer 47 of the pad stack 46 may be removed with an etch process prior to the formation of the node dielectric layer 53.

Following node dielectric layer 53 formation, a conductive material is then formed atop the node dielectric layer 53 filling the trenches 51. The conductive material is typically a doped silicon containing material, such as doped polysilicon. The conductive material is typically deposited using deposition processes including, but not limited to: chemical vapor deposition (CVD), plasma-assisted CVD, high-density chemical vapor deposition (HDCVD), plating, sputtering, evaporation and chemical solution deposition. In one embodiment, in which the conductive material is polysilicon, the deposited polysilicon must be doped with N-type dopant, such as As or P. The conductive material that fills the trenches provides the inner electrode 54 of the trench capacitor 50.

Still referring to FIG. 3, following deposition of the conductive material, a planarization process may be utilized to render the upper surface of the conductive material that is within the trench 51 coplanar with the lower nitride pad layer 48, wherein in some embodiments the planarization step may remove the lower nitride pad layer 48 stopping on the semiconductor substrate 1. As used herein, "planarization" is a material removal process that employs at least mechanical forces, such as frictional media, to produce a planar surface. One example of a planarization process is chemical mechanical planarization. "Chemical mechanical planarization" is a material removal process using both chemical reactions and mechanical forces to remove material and planarize a surface.

Figure 4:
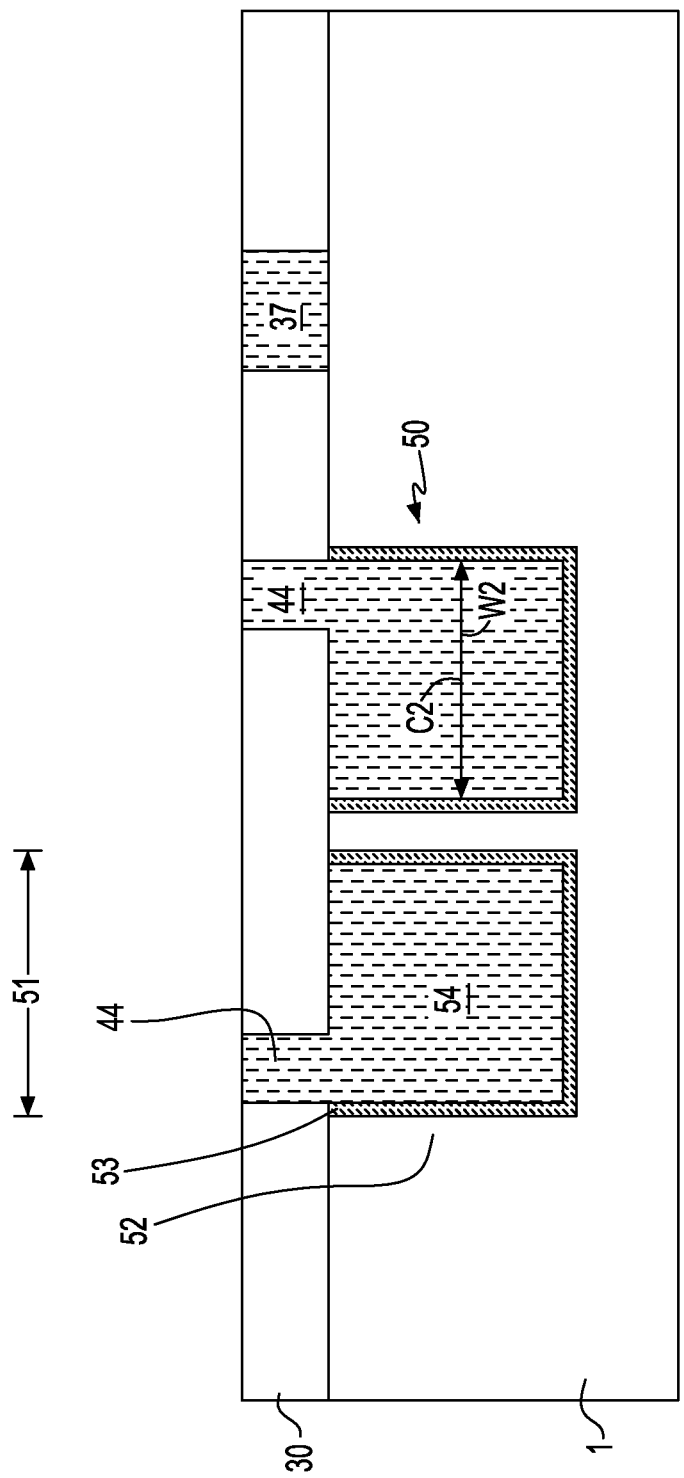
FIG. 4 depicts a side cross-sectional view of depositing a dielectric layer (buried dielectric layer) atop the structure depicted in FIG. 3, and forming a first stud to the semiconductor substrate and a second stud to the inner electrode of the trench capacitor.

FIG. 4 depicts depositing a dielectric layer 30, i.e., buried dielectric layer 30, and forming a first stud 37 to the semiconductor substrate 1 and a second stud 44 to the inner electrode 54 of the trench capacitor 50.

In one embodiment, the dielectric layer 30 (hereafter referred to as buried dielectric layer 30) may include, but is not limited to, an oxide, nitride or oxynitride material. For the purposes of the following disclosure, the buried dielectric layer 30 will be referred to as an oxide. The buried dielectric layer 30 may have a thickness ranging from 5 nm to 100 nm. The buried dielectric layer 30 may be provided by a deposition process, such as chemical vapor deposition, or a growth process, such as oxidation. The upper surface of the buried insulating layer 30 may be planarized, wherein the planarization process may be chemical mechanical polishing.

In a following processing step, vias may be formed through the buried insulating layer 30 to expose a portion of an upper surface of the conductive material of the inner electrode 54 and an upper surface of the semiconductor substrate 1. In one embodiment, vias are formed using photolithography and etching. For example, a layer of photoresist material may be deposited atop the buried dielectric layer 30 and patterned to provide openings exposing the portions of the buried dielectric layer 30 in which the first stud 44 and second stud 37 will be subsequently formed. In a following step, the exposed portions of the buried dielectric layer 30 are etched selective to the photoresist material, the conductive material of the inner electrode 54, and the semiconductor substrate 1. The formation of the via includes an anisotropic etch step that may be reactive ion etch. The via may have a width ranging from about 20 nm to about 100 nm, typically ranging from about 30 nm to about 60 nm.

The first stud 37 and the second stud 44 are then formed within the vias to provide electrical contact to the semiconductor substrate 1 and the inner electrode 54. In one embodiment, the first stud 37 and the second stud 44 may be formed within the via by a deposition step, such as chemical vapor deposition or physical vapor deposition. One example of physical vapor deposition is sputtering. Examples of chemical vapor deposition include, but are not limited to: Atmospheric Pressure CVD (APCVD), Low Pressure CVD (LPCVD) and Plasma Enhanced CVD (PECVD), Metal-Organic CVD (MOCVD) and combinations thereof. In one embodiment, the first stud 37 and the second stud 44 may be composed of $N^+$ polysilicon that is formed using an epitaxial growth process. In one embodiment, the upper surface of the first stud 37 and the second stud 44 may be planarized to be coplanar with the upper surface of the buried dielectric layer 30.

Figure 5:
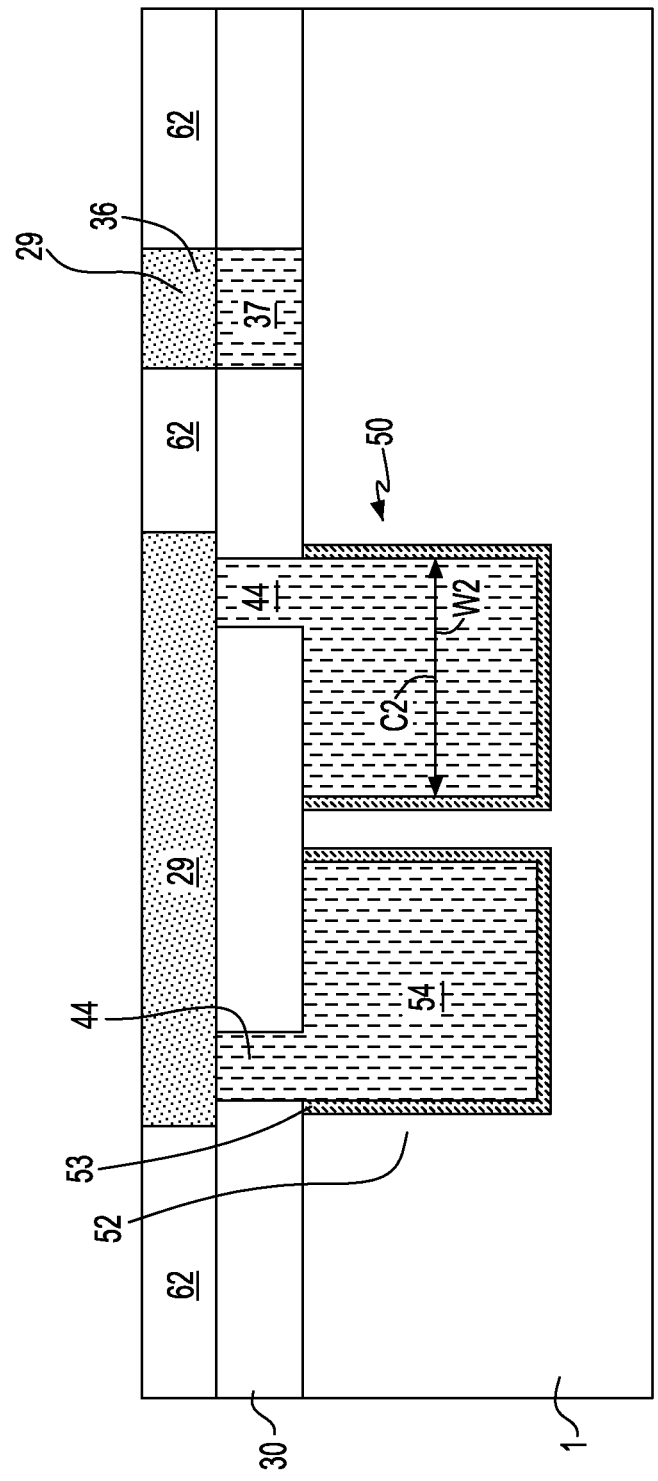
FIG. 5 depicts a side cross-sectional view of forming semiconductor layer (SOI layer) atop the portion of the dielectric layer that is overlying the trench capacitors, and atop the first stud, and atop the second stud, in accordance with one embodiment of the present invention.

FIG. 5 depicts one embodiment of forming a semiconductor-on-insulator (SOI) layer 29 atop the portion of the buried dielectric layer 30 that is present atop the first stud 37 and the second stud 44, in which the SOI layer 29 is also present overlying the trench capacitors 55. In one embodiment, the SOI layer 29 is formed on the buried dielectric layer 30 using a bonding method. Specifically, bonding of the SOI layer 29 and the buried dielectric layer 30 is achieved by first bringing the two structures into intimate contact with each other; optionally applying an external force to the contacted wafers; and then heating the two contacted structures under conditions that are capable of bonding the two structures together. The heating step may be performed in the presence or absence of an external force.

The heating step is typically performed in an inert ambient at a temperature of from 200° to 1050° C. for a time period of from 2 hours to 20 hours. In one embodiment, the bonding is performed at a temperature of from about 200° to about 400° C. for a time period of from about 2 to about 20 hours. The term "inert ambient" is used in the present invention to denote an atmosphere in which an inert gas, such as He, Ar, $N_2$, Xe, Kr or a mixture thereof, is employed. In one embodiment, the ambient used during the bonding process is $N_2$.

Typically, the SOI layer 29 is transferred from a handling layer (not shown). The handling wafer and any adhesive may be removed from the SOI layer 29 following bonding. The handling wafer and the adhesive may be removed utilizing a planarization process, such as grinding, or chemical mechanical polishing. Etching may also be used to remove the handling wafer and the adhesive layer from the bonded structures. In another embodiment, the handling wafer is removed by laser ablation, and the adhesive is removed by a chemical etching process.

The SOI layer 29 may be any semiconductor material, typically being a silicon-containing material. Si-containing materials include, but are not limited to: Si, single crystal Si, polycrystalline Si, SiC, SiGe, SiGeC, and amorphous Si. Other materials suitable for the SOI layer 29 include Ge alloys, GaAs, InAs, InP, as well as other III-V or II-VI compound semiconductors.

Still referring to FIG. 5, following the formation of the SOI layer 29, isolation regions 62 are formed to separate the portion of the SOI layer 29 that is overlying the trench capacitors 50 from the portion of the SOI layer 29 that is overlying the first stud 37. In one embodiment, the isolation regions 62 are formed by etching openings in the SOI layer 29 to expose the underlying buried insulating layer 30 utilizing an etching process, such as reactive-ion etching (RIE) or plasma etching. The etch process may be used in conjunction with an etch mask, e.g., photoresist mask, to protect the portions of the SOI layer 29 that are present overlying the first stud 37, second stud 44, and the portions of the SOI layer 29 that are present overlying the trench capacitors 50. The openings may optionally be lined with a conventional liner material, e.g., an oxide, and then CVD or another like deposition process is used to fill the openings with an oxide, such as silicon oxide, or another like STI dielectric material. A conventional planarization process, such as chemical-mechanical polishing (CMP), may optionally be used to provide a planar structure.

The remaining portion of the SOI layer 29 that is present overlying the trench capacitors 50 is the portion of the SOI layer 29 in which the semiconductor devices 25 are subsequently formed. The remaining portion of the SOI layer 29 that is present overlying the first stud 37 is hereafter referred to as the substrate contact portion 36 of the SOI layer 29.

Figure 6:
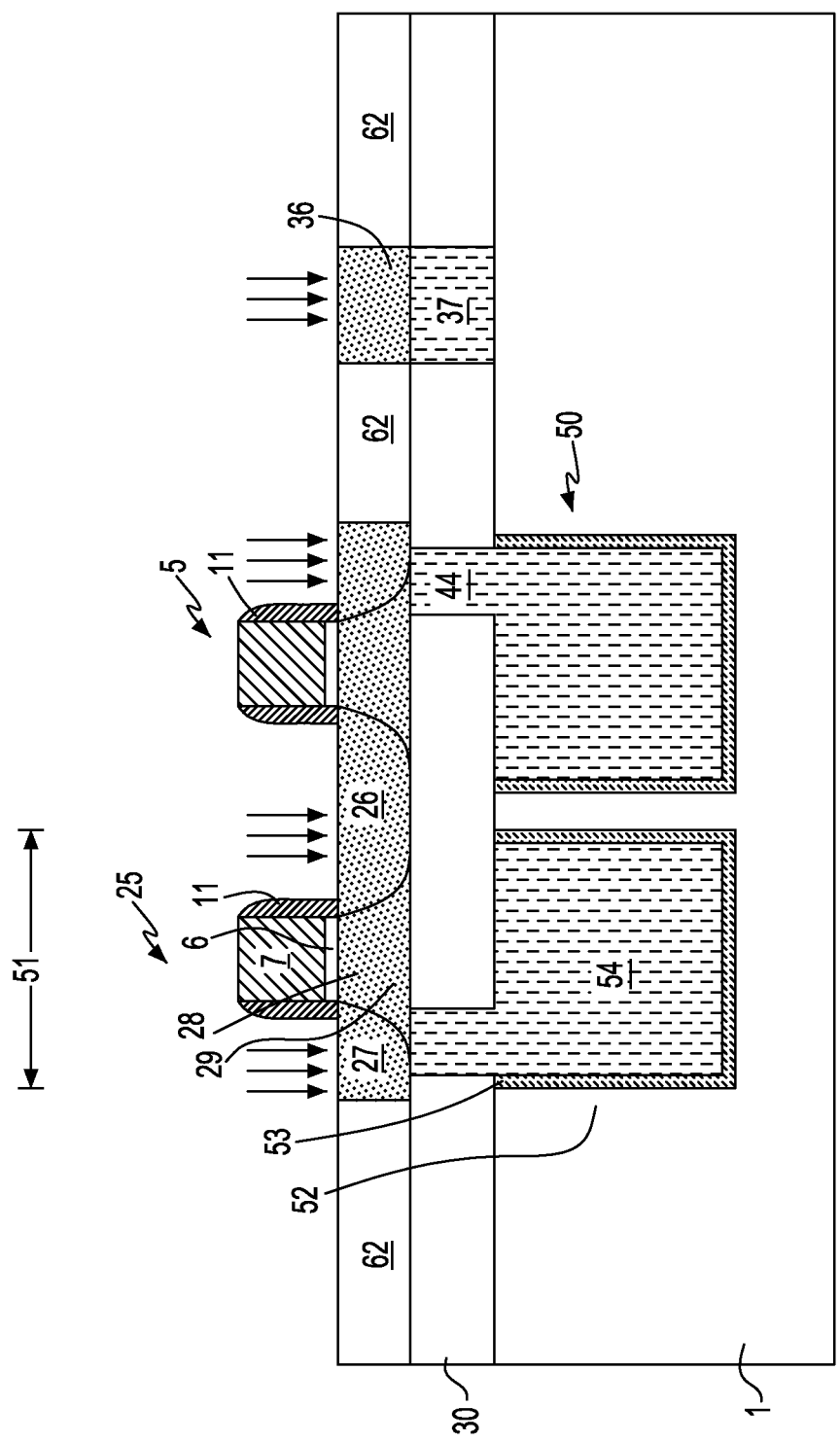
FIG. 6 depicts a side cross-sectional view of forming semiconductor devices on the semiconductor layer that is present overlying the trenches in which the trench capacitors are present, in accordance with one embodiment of the present invention.

FIG. 6 depicts forming semiconductor devices 25 on the portion of the SOI layer 29 that is present overlying the trench capacitors 50, in accordance with one embodiment of the present invention. The gate structure 5 may be formed atop the semiconductor substrate 1 utilizing deposition, lithography and etching processes. More specifically, in one embodiment, a gate structure 5 is provided atop the semiconductor substrate 1 by depositing a gate dielectric layer 6 followed by a gate conductor layer 7 to provide a gate stack. In a following processing step, the gate stack is patterned using photolithography and etching to produce the gate structure 5. For example, following the deposition of the gate dielectric layer 6 and gate conductor layer 7, an etch mask is formed atop the gate conductor layer 7 protecting the portion of the layered stack that provides the gate structure 5, wherein the portions exposed by the etch mask are removed by an anisotropic etch process, such as reactive ion etching. Reactive ion etching is a form of plasma etching, in which the surface to be etched is placed on the RF powered electrode and takes on a potential that accelerates an etching species, which is extracted from a plasma, towards the surface to be etched, wherein a chemical etching reaction takes place in the direction normal to the surface being etched. In one embodiment, the etch mask may be provided by a patterned photoresist layer.

The gate dielectric layer 6 of the gate structure 5 may be composed of an oxide material. Suitable examples of oxides that can be employed as the gate dielectric layer 6 include, but are not limited to $SiO_2$, $Al_2O_3$, $ZrO_2$, $HfO_2$, $Ta_2O_3$, $TiO_2$, perovskite-type oxides and combinations and multi-layers thereof. The gate dielectric layer 6 may also be composed of a nitride, oxynitride, or a combination thereof including said oxide or the gate dielectric may be composed of multiple layers of the aforementioned materials. In one embodiment, the gate dielectric layer 6 is a high-k material typically having a dielectric constant greater than 3.9. In some instances the dielectric constant of the gate dielectric layer 6 is greater than 7.0.

The gate conductor layer 7 of the gate stack may be composed of a silicon containing material, which may be polysilicon. In another embodiment, the gate conductor layer 7 is composed of single crystal Si, polysilicon, SiGe, SiGeC or combinations thereof. In another embodiment, the gate conductor layer 7 may be a metal and/or silicide. In other embodiment, the gate conductor layer 7 is comprised of multilayered combinations of said conductive materials.

In one embodiment, an offset spacer 11 may be formed abutting the gate structure 5. The offset spacer 11 may comprise a dielectric such as a nitride, oxide, oxynitride, or a combination thereof. In one embodiment, in which the offset spacer 11 is composed of an oxide, such as silicon oxide, the offset spacer 11 may be formed by thermal oxidation. In another embodiment, in which the offset spacer 11 is composed of a nitride, such as silicon nitride, the offset spacer 11 may be formed using deposition and etch processes. It is noted that the offset spacer 11 is optional, and embodiments are contemplated in which the spacer is not present.

Source and drain regions 26, 27 are then formed into the semiconductor substrate 5. The source and drain dopant regions 26, 27 are formed utilizing ion implantation and an annealing step. The annealing step serves to activate the dopants that were implanted by the previous implant step.

The semiconductor devices 25 may be field effect transistors having n-type or p-type doped source regions 26 and drain regions 27. P-type doped source and drain regions 26, 27 are typically produced with group III-A elements. N-type doped source and drain regions 26, 27 are typically produced with group V elements. The source region and drain regions 26, 27 may include extension regions (not shown) and deep source and drain regions. Halo implant regions (not shown) may also be present. In one embodiment, during the ion implantation steps to provide the source region 26 and drain region 27, the substrate contact portion 36 of the SOI layer 29 is also doped to provide an electrically conductive region.

In a following process sequence, silicided contacts 12 to the source region 26 of the semiconductor devices 25, and the substrate contact portion 36 of the SOI layer 29, as well as metal interconnects 77, 78, can be formed to provide the memory device 100 depicted in FIG. 1A. Silicide formation typically requires depositing a refractory metal such as Co, W, Ni or Ti onto the surface of a Si-containing material or wafer. Following deposition, the structure is then subjected to an annealing step using conventional processes such as, but not limited to, rapid thermal annealing. During thermal annealing, the deposited metal reacts with Si forming a metal silicide.

Following silicide formation, a layer of dielectric material (not shown) may be blanket deposited atop the entire substrate and planarized. The blanket dielectric may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric is then patterned and etched to form via holes to the source regions 26 of the semiconductor devices 25, and the substrate contact portion 36 of the SOI layer 29. Following via formation, interconnects 77, 78 are formed by depositing a conductive metal into the via holes using conventional processing, such as CVD or plating. The conductive metal may include, but is not limited to: tungsten, copper, aluminum, silver, gold, and alloys thereof.

Figure 7:
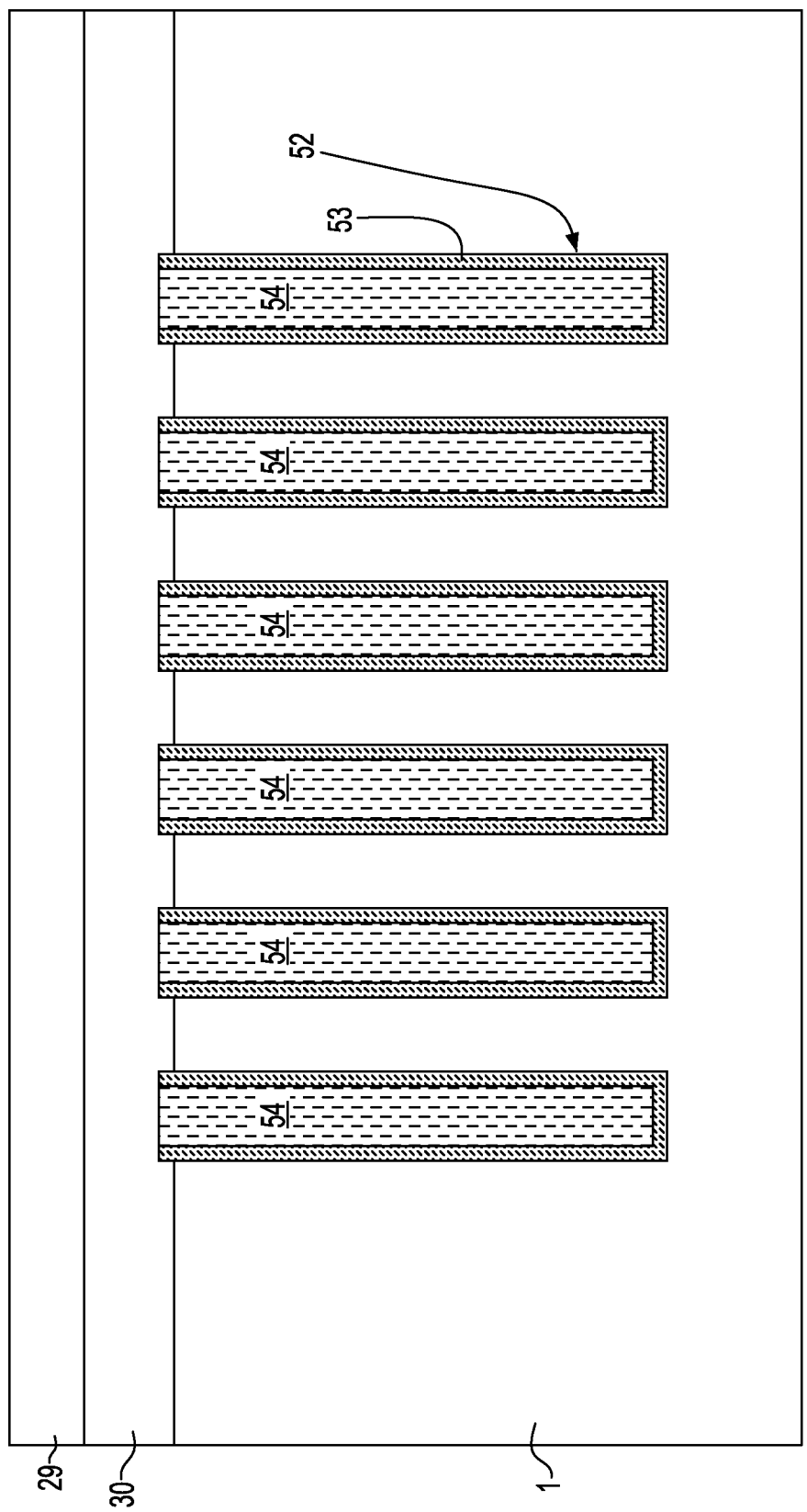
FIG. 7 depicts a side cross-sectional view of a method step for another embodiment of the present invention, in which following the formation of the trench structures, as depicted in FIG. 3, a buried insulator layer is formed followed by a semiconductor (SOI) layer to provide a semiconductor on insulator (SOI) substrate configuration.
Figure 8:
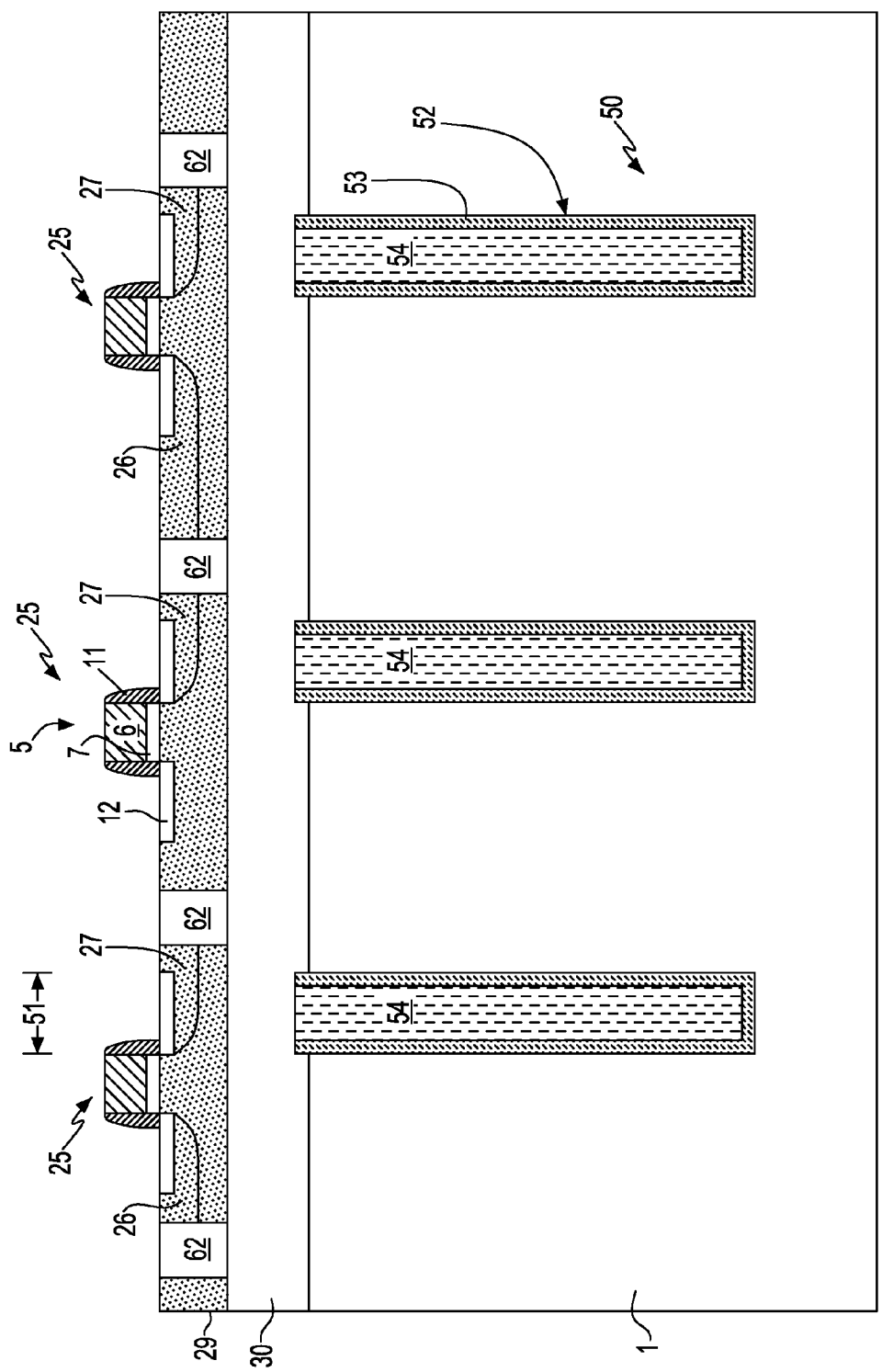
FIG. 8 depicts a side cross-sectional view of forming semiconductor devices on the SOI layer of the structure depicted in FIG. 7, in accordance with one embodiment of the present invention.
Figure 9:
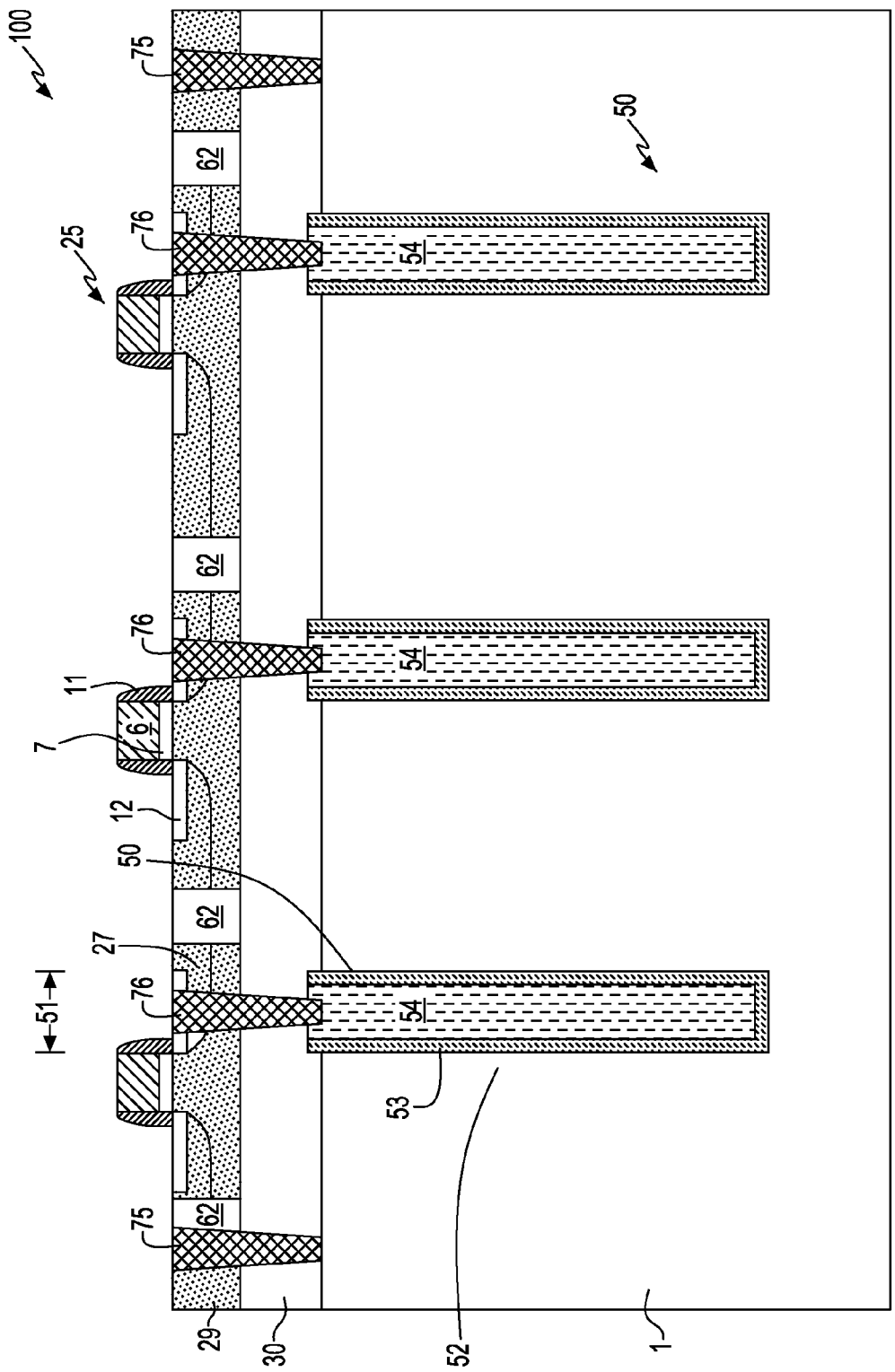
FIG. 9 depicts a side cross-sectional view of forming a first contact to the semiconductor substrate and a second contact to the inner electrode of the trench capacitor depicted in FIG. 8.

FIGS. 7-9 depict another embodiment for a method of forming a memory device 100. The process sequence disclosed in FIGS. 7-9 provides a trench manufacturing process that is isolated from the semiconductor device manufacturing process. Isolating the trench capacitor manufacturing process from the semiconductor device manufacturing process substantially eliminates the possibility of contamination of the trench capacitors from the processing to provide the semiconductor devices, and vice versa. Further, although the semiconductor devices 25 depicted in FIGS. 8 and 9 are offset from the underlying trench capacitor 50, the process sequence depicted in FIGS. 7-9 allows for the semiconductor devices 25 to be positioned centrally overlying the trench capacitors 50 in order to increase device density in the memory device 100. Additionally, the process sequence does not requires a strap region composed of Arsenic-doped Silicate Glass (ASG) between the semiconductor device 25 and the trench capacitor 50, or require a lower electrode that is provided by an Arsenic-doped Silicate Glass (ASG) diffusion process. Further, in one embodiment, the process sequence disclosed in FIGS. 7-9 may utilize a single polysilicon fill process to provide a robust trench capacitor without requiring a polysilicon recess step, i.e., polysilicon etching.

FIG. 7 depicts forming a buried dielectric layer 30 atop a semiconductor substrate 1 having trench capacitors 50 formed therein, followed by forming an SOI layer 29 atop the buried dielectric layer 30 to provide an SOI substrate configuration. The semiconductor substrate 1 having the trench capacitors 50 present therein may be provided by the process described in reference to FIGS. 1-3, in which prior to the formation of the buried dielectric layer 30 the lower pad nitride layer 48 may be removed using an etching or planarization process.

The trench capacitor 50 includes an outer electrode 52 that is provided by a doped portion of the semiconductor substrate 1, an inner electrode 54 provided by a conductive fill material, and a node dielectric layer 53 located between the outer electrode 52 and the inner electrode 54. In one example, the node dielectric 53 is composed of a high-k dielectric material, although other dielectric materials, such as silicon nitride, have been contemplated for the node dielectric layer 53. The conductive fill material typically includes n$^+$ polysilicon or an elemental metal. The doped portion of the semiconductor substrate 1 that provides the outer electrode 52 is typically a silicon containing region that has been doped to an n$^+$ conductivity.

The buried insulating layer 30 may include, but is not limited to, an oxide, nitride or oxynitride material. The buried dielectric layer 30 may be provided by a deposition process, such as chemical vapor deposition, or a growth process, such as oxidation. The upper surface of the buried insulating layer 30 may be planarized, wherein the planarization process may be chemical mechanical polishing (CMP).

The SOI layer 29 is then formed atop the buried insulating layer 30 using a layer transfer or bonding method. Specifically, bonding of an SOI layer 29 and the buried dielectric layer 30 is achieved by first bringing the two structures into intimate contact with each other; optionally applying an external force to the contacted wafers; and then heating the two contacted structures under conditions that are capable of bonding the two structures together. The details of the SOI layer 29 and the bonding method for forming the SOI layer 29 atop the buried insulating layer 30 are described above in reference to FIG. 5.

Referring to FIG. 8, following the formation of the SOI layer 29, isolation regions 62 are formed to separate the portions of the SOI layer 29 on which adjacent semiconductor devices will be subsequently formed. In one embodiment, the isolation regions 62 are formed by etching openings in the SOI layer 29 to expose the underlying buried insulating layer 30 utilizing a dry etching process, such as reactive-ion etching (RIE) or plasma etching. The openings may optionally be lined with a liner material, e.g., an oxide, and then CVD or another like deposition process is used to fill the trench with an oxide, such as silicon oxide, or another like STI dielectric material. A planarization process, such as chemical-mechanical polishing (CMP), may optionally be used to provide a planar structure.

FIG. 8 further depicts forming semiconductor devices 25 on the SOI layer 29. The semiconductor device 25 may include a source region 26, a drain region 27, and a gate structure 5, in which a channel region 28 is present underlying the gate structure 5 and between the source region 26 and the drain region 27. In one embodiment, the semiconductor device 25 may be present on a SOI layer 29 that is separated from the semiconductor substrate 1 by the buried dielectric layer 30. Typically, the semiconductor device 25 is a planar device, in which the length of the channel 28 is parallel to the upper surface of the SOI layer 29, in which the semiconductor device 25 is formed. The semiconductor device 25 may be an n-channel field effect transistor (n-FET) or a p-channel field effect transistor (p-FET). The details of the semiconductor devices 25, and methods for forming the semiconductor devices 25, are described above in reference to FIG. 6.

FIG. 9 depicts one embodiment of forming a first contact 75 to the semiconductor substrate 1 and a second contact 76 to the inner electrode 54 of the trench capacitor 50. More specifically, after forming the semiconductor devices 25 on the SOI layer 29, openings are formed through the portion of the SOI layer 29 corresponding to the drain region 27 of the semiconductor devices 25, and the underlying buried insulating layer 30, to expose the upper surface of the inner electrode 54 of the trench capacitor 50. Openings are also formed through the SOI layer 29 and the underlying buried insulating layer 30 to expose the upper surface of the semiconductor substrate 1.

The openings may be formed utilizing lithography and etching. For example, the lithographic step may include applying a photoresist to the SOI layer 29, exposing the photoresist to a pattern of radiation and developing the pattern into the exposed photoresist utilizing a resist developer. The etching step used in providing the opening in the SOI layer 29 may include chemical reactive ion etching (RIE), plasma etching, ion beam etching or laser ablation. Reactive Ion Etching is a form of plasma etching that during etching the surface to be etched is placed on the RF powered electrode, wherein the surface to be etched takes on a potential that accelerates the etching species extracted from a plasma toward the surface, to be etched in which the chemical etching reaction is taking place in the direction normal to the surface. Thereafter, the buried dielectric layer 30 is etched using an etch process that is selective to the inner electrode 54 and the semiconductor substrate 1. Following etching, the photoresist is typically removed from the structure utilizing a resist stripping process, such as oxygen ashing.

In a following process step or sequence, a conductive material is formed or deposited within the opening to provide the first contact 75 and the second contact 76. The conductive material may be a metal including, but not limited to: Ti, Ag, Ta, Al, Pt, Cu, W or combinations thereof. In another embodiment, the conductive material may be doped polysilicon. In one embodiment, the conductive material may be deposited utilizing a physical vapor deposition (PVD) process, such as plating or sputtering. In another embodiment, the conductive material is formed using a chemical vapor deposition (CVD) process.

Figure 10:
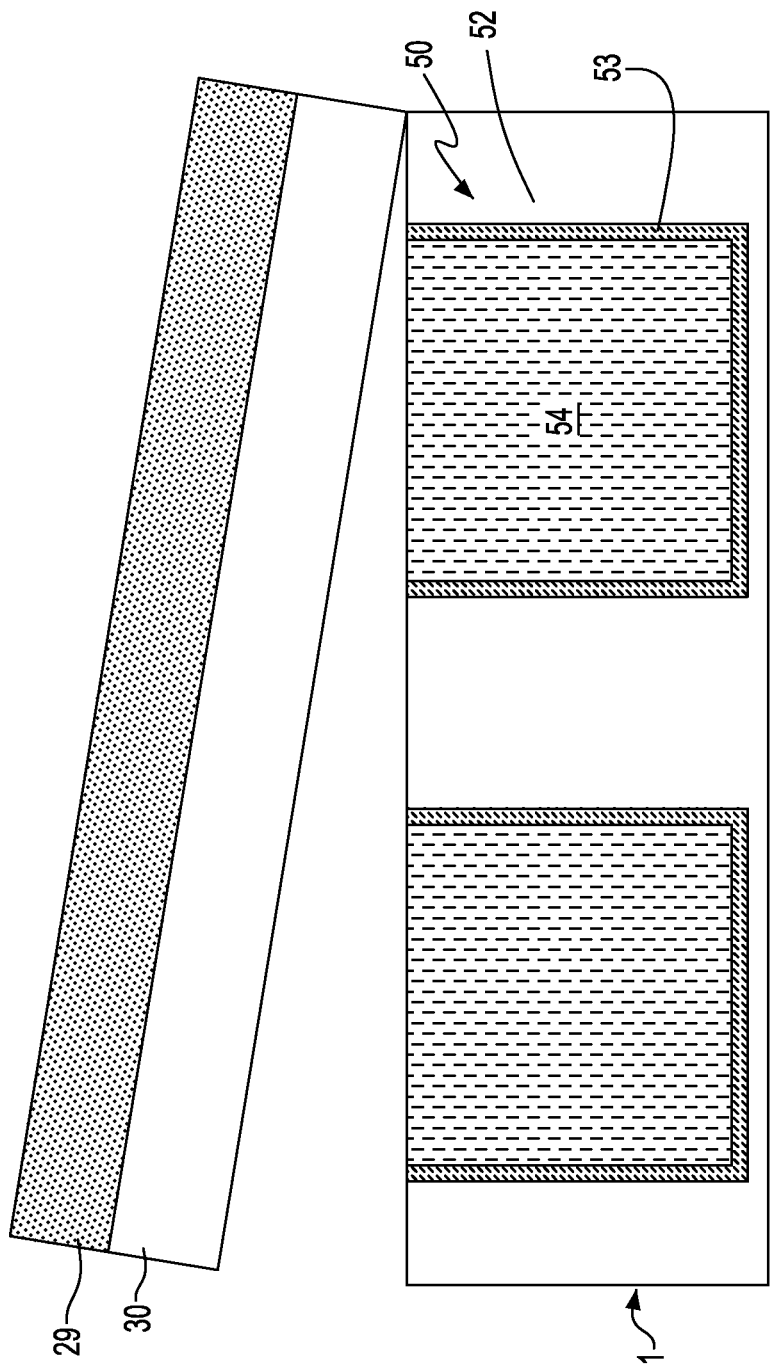
FIG. 10 depicts a side cross-sectional view of an initial structure for another embodiment of a method of forming a memory device having a semiconductor on insulator (SOI) substrate arrangement using wafer bonding.
Figure 11:
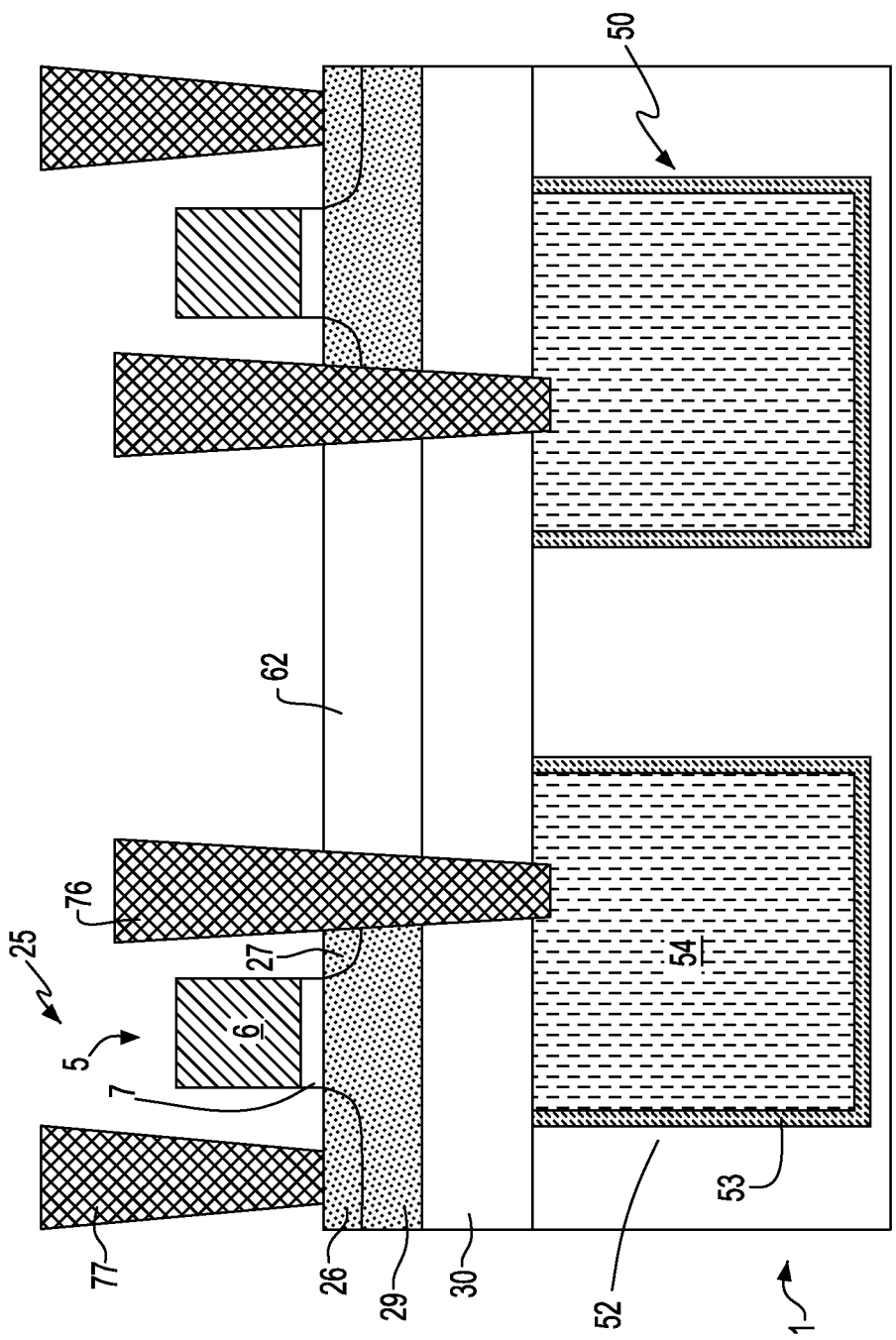
FIG. 11 depicts a side cross-sectional view of forming semiconductor devices on the silicon-on-insulator (SOI) layer depicted in FIG. 10, and forming contacts to the trench capacitors, in accordance with one embodiment of the present invention.

FIGS. 10-11 depict another method for forming a memory device including semiconductor devices 25, such as planar semiconductor devices, and trench capacitors 50. The embodiment depicted in FIGS. 10-11 may employ very large trench capacitors, typically having a capacitance ranging from 10 fF to 50 fF. In another example, the capacitance of the capacitors may range from 25 fF to 50 fF.

Additionally, the memory devices formed by the method described with reference to FIGS. 10 and 11 do not require bottling of the trenches or collar isolation regions. Further, although the semiconductor devices depicted in FIG. 11 are offset from the underlying trench capacitor, the process sequence depicted in FIGS. 10 and 11 allows for the semiconductor devices 25 to be positioned centrally overlying the trench capacitors 50 in order to increase device density in the memory device.

FIG. 10 depicts forming a semiconductor-on-insulator (SOI) substrate configuration having trench capacitors 50 present therein using wafer bonding methods. In this embodiment, the buried dielectric layer 30 and the SOI layer 29 are both bonded to the semiconductor substrate 1 including the trench capacitor 50. In this embodiment, the buried dielectric layer 30 is bonded to the semiconductor substrate 1. Specifically, bonding of the buried dielectric layer 30 and the semiconductor substrate 1 is achieved by first bringing the two structures into intimate contact with each other; optionally applying an external force to the contacted wafers; and then heating the two contacted structures under conditions that are capable of bonding the two structures together. The details of this bonding method are described above in reference to FIG. 5. FIG. 11 depicts a side cross-sectional view of forming semiconductor devices 25 on a silicon-on-insulator (SOI) layer 29 and forming contacts 76, 77 to the trench capacitors

50. The details of semiconductor devices 25 and the contacts 76, 77 are described above in reference to FIGS. 8 and 9.

Figure 12:
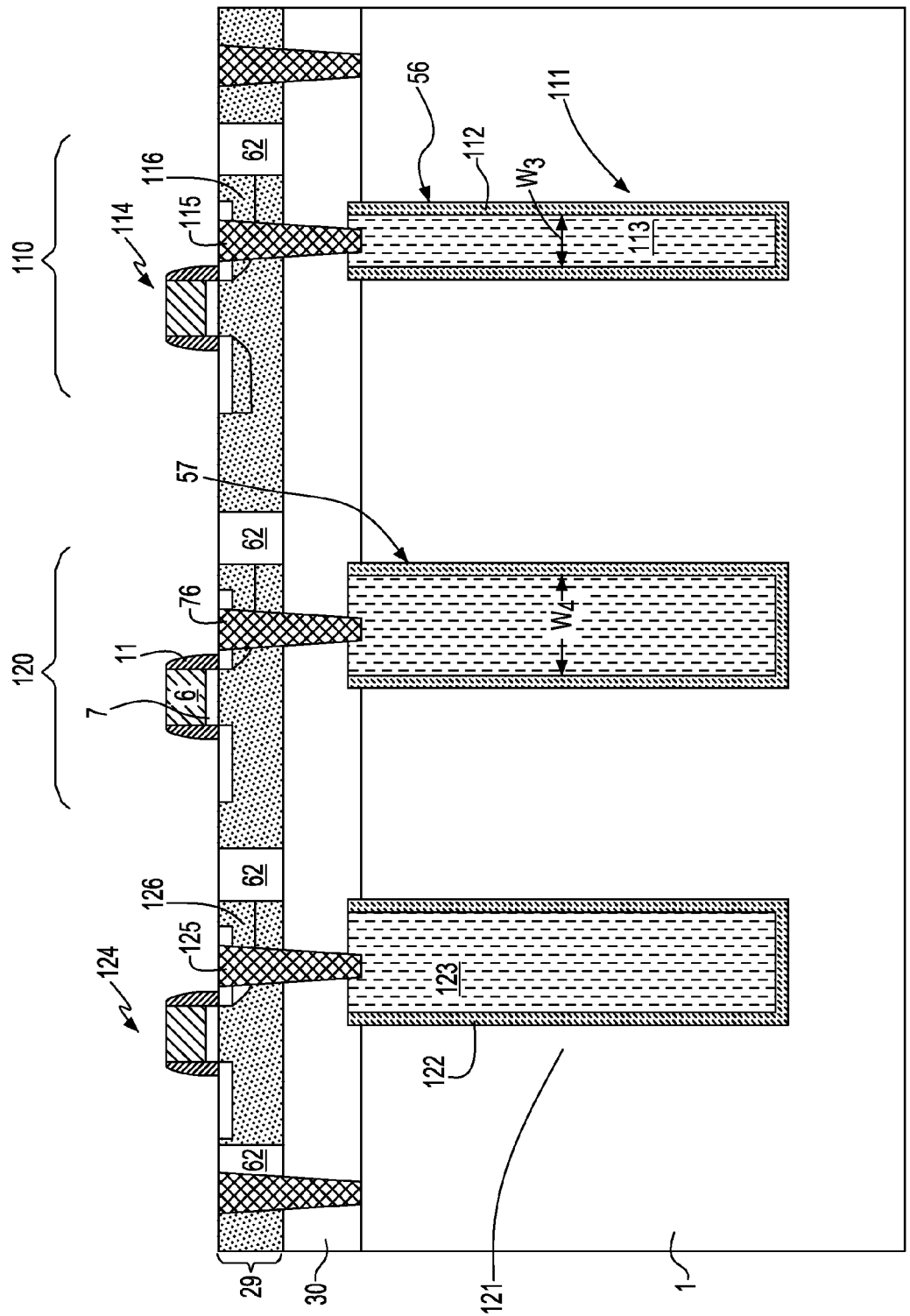
FIG. 12 depicts a side cross-sectional view of another embodiment of a memory device including a first trench capacitor of a first width and a second trench capacitor of a second width, in accordance with the present invention.

Referring to FIG. 12, in another embodiment, a structure is provided having a first memory device 110 including a trench capacitor 56 of a first width $W_3$, i.e., trench width, and a second memory device 120 include a trench capacitor 57 of a second width $W_4$, i.e., trench width, in which the second width $W_4$ is greater than the first width $W_3$. The first width $W_3$ of the trench capacitor 56 to the first memory structure 110 typically ranges from 30 nm to 180 nm. In another embodiment, the first width $W_3$ of the trench capacitor 56 to the first memory structure 110 typically ranges from 30 nm to 100 nm. The second width $W_4$ of the trench capacitor 57 to the second memory structure 120 typically ranges from 150 nm to 500 nm. In another embodiment, the second width $W_4$ of the trench capacitor 57 to the second memory structure 120 typically ranges from 150 nm to 300 nm. In another embodiment, the first width $W_3$ of the first trench capacitor 56 ranges from 30 nm to 180 nm, and the second width $W_4$ of the second trench capacitor 57 ranges from 150 nm to about 500 nm.

The first memory device 110 typically has a lesser capacitance than the second memory structure 120, and is typically suited for high speed applications, such as on-chip cache. The second memory device 120 typically has a capacitance that is greater than the first memory device 110, and is typically suited for long retention applications, such as off-chip embedded memory.

The first memory device 110 may include a first trench capacitor 56 having a first outer electrode 111 provided by a first doped portion of a semiconductor substrate 1, a first inner electrode 113 provided by a first conductive fill material, and a first node dielectric layer 112 located between the outer electrode 111 and the inner electrode 113. The first memory device 110 further includes at least one first semiconductor device 114 separated from the first trench capacitor 56 by a dielectric layer 30 (also referred to as a buried dielectric layer 30). The first semiconductor device 114 is in electrical contact with the first trench capacitor 56 through a first electrical contact 115 extending from a drain 116 of the first semiconductor device 114 through the dielectric layer 30 to the first inner electrode 113.

The second memory device 120 may include a second trench capacitor 57 having a second outer electrode 121 provided by a second doped portion of the semiconductor substrate 1, a second inner electrode 123 provided by a second conductive fill material, and a second node dielectric layer 122 located between the second outer electrode 121 and the second inner electrode 123. The second memory device 120 may further include a second semiconductor device 124 separated from the second trench capacitor 57 by the buried dielectric layer 30. The second semiconductor device 124 is in electrical contact with the second trench capacitor 57 through a second electrical contact 125 extending from a drain 126 of the second semiconductor device 124 through the buried dielectric layer 30 to the second inner electrode 123.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method for forming a memory device comprising:
providing a semiconductor substrate;
forming a trench capacitor in the semiconductor substrate, the trench capacitor including an inner electrode comprised of a conductive fill material within a trench;
forming a buried dielectric layer on the semiconductor substrate and on the trench capacitor;
forming a first stud in the buried dielectric layer in electrical communication with the conductive material that is present within the trench and a second stud in the buried dielectric layer in electrical communication with the semiconductor substrate;
forming a semiconductor layer on the buried dielectric layer; and
forming a semiconductor device atop the semiconductor layer over the trench, the semiconductor device comprising a gate structure, a source region and a drain region, wherein at least the gate structure, the source region and the drain region of the semiconductor device is formed after the trench capacitor, and the drain region is in electrical communication with the first stud, wherein the gate structure of the semiconductor device is substantially centrally positioned over the trench capacitor.

2. The method of claim 1, wherein forming the trench that contains the trench capacitor comprises forming a pad stack atop the semiconductor substrate including a first pad dielectric layer on the semiconductor substrate and a second pad dielectric layer on the first pad dielectric layer; forming a photoresist mask atop the pad stack; etching the pad stack selective to the photoresist mask; and etching the semiconductor substrate to provide the trench using a remaining portion of the pad stack as an etch mask.

3. The method of claim 2, further comprising forming a node dielectric on the sidewall of the trench prior to forming the inner electrode of the trench capacitor.

4. The method of claim 1, wherein the forming of the conductive material within the trench includes chemical vapor deposition or physical deposition of the conductive material within the trench followed by planarization.

5. The method of claim 1, wherein at least one of the buried dielectric layer and the semiconductor layer are formed by deposition or layer transfer.

6. The method of claim 1, wherein the forming of the semiconductor device atop the semiconductor layer comprises forming a gate dielectric and a gate conductor of the gate structure followed by ion implantation of a p-type or n-type dopant to provide the source region and the drain region of the semiconductor device.

7. A method for forming a memory device comprising:
providing a semiconductor substrate having at least one trench capacitor formed therein;
forming a buried dielectric layer on the semiconductor substrate;
forming at least one semiconductor device atop the buried dielectric layer comprising a gate structure, a source region and a drain region, wherein at least the gate structure, the source region and the drain region of the semiconductor device is formed after the trench capacitor, wherein the gate structure of the semiconductor device is substantially centrally positioned over the trench capacitor; and
forming a first contact through the buried dielectric layer in electrical contact with the semiconductor substrate and a second contact from the drain region for each of the at least one semiconductor device through the buried dielectric layer into electrical contact to an inner electrode for each of the at least one trench capacitor.

8. The method of claim 7, wherein at least one of the first contact and the second contact comprises a metal.

9. The method of claim 7, wherein the memory device does not include an arsenic doped silicon glass strap region between the semiconductor device and the trench capacitor.

10. The method of claim 7, wherein the at least one trench capacitor includes an outer electrode comprised of a doped sidewall of a trench that contains the at least one trench capacitor, a node dielectric layer that is present on the doped sidewall of the trench, and an inner electrode provided by a conductive fill material.

11. The method of claim 7, wherein forming the buried dielectric layer comprises deposition or layer transfer.

12. The method of claim 7 wherein the forming of the semiconductor device comprises forming a semiconductor layer on the buried dielectric layer and forming a gate dielectric and a gate conductor of the gate structure on the semiconductor layer followed by ion implantation of a p-type or n-type dopant to provide the source region and the drain region of the semiconductor device.

13. The method of claim 7, wherein the forming of the semiconductor layer comprises deposition or layer transfer.

14. The method of claim 7, wherein the at least one trench capacitor includes a first trench capacitor and a second trench capacitor, wherein the first trench capacitor is formed within a first trench and the second trench capacitor is formed within a second trench, wherein a first width of the first trench is different than a second width of the second trench.

15. The method of claim 14, wherein the first width ranges from 30 nm to 180 nm, and a second width ranges from 150 nm to 300 nm.

16. A method for forming a memory device comprising:
providing a semiconductor substrate;
forming a trench capacitor in the semiconductor substrate, the trench capacitor including an inner electrode comprised of a conductive fill material within a trench;
forming a buried dielectric layer on the semiconductor substrate and on the trench capacitor;
forming a first stud in the buried dielectric layer in electrical communication with the conductive material that is present within the trench and a second stud in the buried dielectric layer in electrical communication with the semiconductor substrate;
forming a semiconductor layer on the buried dielectric layer; and
forming a semiconductor device atop the semiconductor layer over the trench, the semiconductor device comprising a gate structure, a source region and a drain region, wherein the gate structure of the semiconductor device is substantially centrally positioned over the trench capacitor.

17. The method of claim 16, wherein forming the trench that contains the trench capacitor comprises forming a pad stack atop the semiconductor substrate including a first pad dielectric layer on the semiconductor substrate and a second pad dielectric layer on the first pad dielectric layer; forming a photoresist mask atop the pad stack; etching the pad stack selective to the photoresist mask; and etching the semiconductor substrate to provide the trench using a remaining portion of the pad stack as an etch mask.

18. The method of claim 16, further comprising forming a node dielectric on the sidewall of the trench prior to forming the inner electrode of the trench capacitor.

19. The method of claim 16, wherein the forming of the conductive material within the trench includes chemical vapor deposition or physical deposition of the conductive material within the trench followed by planarization.

20. The method of claim 16, wherein the forming of the semiconductor device atop the semiconductor layer comprises forming a gate dielectric and a gate conductor of the gate structure followed by ion implantation of a p-type or n-type dopant to provide the source region and the drain region of the semiconductor device.

* * * * *